(12) United States Patent
Rakhovsky et al.

(10) Patent No.: US 10,768,531 B1
(45) Date of Patent: Sep. 8, 2020

(54) SYSTEM AND METHOD OF MASKLESS LITHOGRAPHY WITH THE USE OF A CURVILINEAR HOLOGRAM

(71) Applicants: Vadim Rakhovsky, Rockville, MD (US); Vitaly Chernik, Omsk (RU); Mikhail Borisov, Moscow (RU); Aleksey Shamaev, Moscow (RU); Dmitry Chelyubeev, Dmitrov (RU)

(72) Inventors: Vadim Rakhovsky, Rockville, MD (US); Vitaly Chernik, Omsk (RU); Mikhail Borisov, Moscow (RU); Aleksey Shamaev, Moscow (RU); Dmitry Chelyubeev, Dmitrov (RU)

( * ) Notice: Subject to any disclaimer, the term of this patent is extended or adjusted under 35 U.S.C. 154(b) by 0 days.

(21) Appl. No.: 16/438,922

(22) Filed: Jun. 12, 2019

(51) Int. Cl.
*G03H 1/08* (2006.01)
*G03B 27/42* (2006.01)
*G03F 7/20* (2006.01)
*G03H 1/22* (2006.01)

(52) U.S. Cl.
CPC ....... *G03F 7/70408* (2013.01); *G03H 1/0866* (2013.01); *G03H 1/0891* (2013.01); *G03H 1/2286* (2013.01); *G03H 2222/52* (2013.01)

(58) Field of Classification Search
CPC .............. G02B 5/32; G02B 2027/0174; G02B 27/0172; G02B 27/0103; G02B 5/18; G02B 27/0101; G02B 27/0037; G02B 27/4205; G02B 2027/0105; G02B 26/12; G02B 27/0944; G02B 5/02; G02B 5/0252; G02B 5/1819; G02B 5/1842; G02B 2027/0109; G02B 2027/014; G02B 21/0032; G03H 1/0005; G03H 1/2294; G03H 1/2205; G03H 1/0248; G03H 1/0443; G03H 1/0808; G03H 1/04; G03H 1/22; G03H 2001/005; G03H 1/08; G03H 2001/0439; G03H 2001/2226; G03H 2001/0825; G03H 2001/2615; G03H 2001/303; G03H 1/0252; G03H 1/0272; G03H 1/0476; G03H 1/265; G03H 1/30; G03H 2001/0016; G03H 2222/20; G03H 2222/22

See application file for complete search history.

(56) References Cited

U.S. PATENT DOCUMENTS

| 9,310,768 | B2 | 4/2016 | Rakhovsky et al. |
| 9,323,219 | B2 | 4/2016 | Rakhovsky et al. |
| 9,952,516 | B1 | 4/2018 | Rakhovsky et al. |
| 10,162,307 | B2 | 12/2018 | Rakhovsky et al. |
| 2013/0265560 | A1 * | 10/2013 | Dinger ................ G03F 7/70058 355/67 |

* cited by examiner

Primary Examiner — Mesfin T Asfaw

(57) ABSTRACT

A system that contains a semi-ellipsoidal SLM holder supporting a plurality of flat rectangular SLMs, which are placed onto the semi-ellipsoidal surface of the holder in the most surface-covering way. The system contains a coherent light source placed in the first focal point of the ellipsoid. The second focal point of the ellipsoid defines the area in which an image-receiving object is to be placed. All the SLMs are illuminated by a diverging light beam emitted from the coherent light source. In each SLM, the light is subjected to phase-amplitude modulation and is converted into an image-carrying beam, which convergently fells onto the object on which the target image is to be produced. Thus, a pattern is formed on the object by a maskless method in which a plurality of SLMs are combined into a common image-forming holographic unit.

9 Claims, 4 Drawing Sheets

SYSTEM AND METHOD OF MASKLESS LITHOGRAPHY WITH THE USE OF A CURVILINEAR HOLOGRAM

FIELD OF THE INVENTION

The present invention relates to the semiconductor industry, in particular, to microlithography, and more specifically to a system and method of maskless lithography with the use of a curvilinear hologram.

DESCRIPTION OF THE RELATED ART

Lithography and, in particular, photolithography is a well-known technique in semiconductor and printed circuit board (PCB) manufacture for creating electrical components and circuits. Photolithography involves placing a mask in front of a substrate, which has been covered by a layer of photoresist, before exposing both the mask and the substrate to light by projecting an image, e.g., an IC pattern. The areas of photoresist that are exposed to light react and change chemical properties. The photoresist is then developed for removing the exposed portions of photoresist for a positive resist or the unexposed portions for a negative resist. The pattern formed in the photoresist allows further processing of the substrate, e.g., by etching, depositing, or implanting.

Thus, existing projection devices designed to generate images on a light-sensitive layer have a number of essential drawbacks, such as fundamental difficulties of combining high resolution and depth of exposure in one device, complication in the optical system and technology of producing a projected object (a mask) as the wavelength used for projection becomes shorter, low technological flexibility in the production process, very high cost of modifications and in correction of errors (image defects), and unfeasibility in the principle of diversified manufacturing, i.e., fabrication of various ICs on the same substrate during a common technological process.

An attempt was made to solve the above problems by a method for synthesis and formation of a digital hologram for use in microlithography disclosed in U.S. Pat. No. 9,310,768 issued on Apr. 12, 2016 to Rakhovsky, et al. The proposed method makes it possible to manufacture a holographic mask capable of producing an image pattern that contains elements of a sub-wavelength size along with decreased deviations from the original pattern. The original pattern is converted into a virtual electromagnetic field and is divided into a set of virtual cells with certain amplitudes and phases, which are mathematically processed for obtaining the virtual digital hologram. The calculation of the latter is based on parameters of the restoration wave, which is used to produce the image pattern from the mask, and on computer optimization by variation of amplitudes and phases of the set of virtual cells and/or parameters of the virtual digital hologram for reaching a satisfactory matching between the produced image pattern and the original pattern. The obtained virtual digital hologram provides physical parameters of the actual hologram that is to be manufactured.

However, U.S. Pat. No. 9,310,768 does not teach how to synthesize the hologram and restore an image from the hologram when the features of the hologram mask are too small for patterning and therefore are beyond the technological abilities of the conventional methods.

The above problem was solved by Rakhovsky, et al. as disclosed in U.S. Pat. No. 9,323,219 issued to the aforementioned applicants on Apr. 26, 2016. In the calculation of virtual components of the hologram, the method includes a step, wherein the entire virtual hologram is increased in proportion to the degree of the divergence of the initial light beam. This facilitates virtual processing of the fine and delicate elements of the virtual hologram. Upon completion of the virtual processing, the final data needed for manufacturing of the actual digital hologram, e.g., on a lithograph, are obtained.

The holographic methods and systems described above relate to formation of digital holograms with the use of flat reflective surfaces. The advantage of a curvilinear mirror over a flat one is that a plane mirror is absolutely unsuitable for operations with high-aperture beams. This is because in the case of high-aperture beams it is necessary to convert a diverging beam into a converging one, which cannot be achieved with a flat mirror. The problem associated with high diffraction angles of high-aperture beams will remain unsolved.

In the case of a flat mirror surface of a large size, the production of a lens needed for forming a converging beam may be essentially more expensive than in the case of a spherical mirror. Aberration errors, which occur in the case of a concave curvilinear mirror, can be compensated by calculations at a hologram synthesis stage. An ellipsoidal reflective surface is advantageous in that it easier eliminates aberration. Also, since the reference source remains spherical, the scheme with an ellipsoidal mirror will have a lower spatial frequency of the pattern on the mask.

Regarding the use of a digital hologram dynamically controlled with the use of a Spatial Light Modulator (hereinafter SLM), it should be noted that the use of an SLM makes it possible to shorten the production time and optimize the manufacturing process. The use of a scheme with an SLM allows solving such problems as unpredictable effects of vibrations and thermal deviations on the aberration. As compared to an amplitude modulator, a phase modulator has a significantly higher diffraction efficiency.

A system and a method for generating a lithographic image that uses a reflective concave curvilinear surface are disclosed, e.g., in U.S. Pat. No. 9,952,516 issued on Apr. 24, 2018 to Rakhovsky, et al. The disclosed system for generating a lithographic image contains a light source that emits a diverging light beam and a reflective concave curvilinear surface onto which the diverging light beam falls and which reflects the diverging beam in the form of a converging beam. A digital hologram, which is coded in accordance with the initial lithographic image either preliminarily or dynamically, is placed into the converging beam between the reflective surface and the image-receiving object. The image of an initial lithographic pattern formed on the image-receiving object is subsequently used in the processes of microlithography.

An SLM makes it possible either to create a pattern instead of a conventional mask, which is then projected via a projection objective, to the exposed object, or to create a hologram, which forms a target pattern image on the exposed object.

However, U.S. Pat. No. 9,323,219 does not teach how the proposed method can be used in lithographical practice. This problem is solved by U.S. Pat. No. 10,162,307 issued on Dec. 25, 2018 to Rakhovsky, et al., which discloses a modification of the system and method for generating a lithographic image with the use of a reflective concave curvilinear.

SUMMARY OF THE INVENTION

The present invention relates to the semiconductor industry, in particular, to microlithography, and more specifically to a system and method of maskless lithography with the use of a curvilinear hologram. The system contains a semi-ellipsoidal SLM holder supporting a plurality of flat rectangular SLMs, which are placed onto the concave semi-ellipsoidal surface of the holder in the most surface-covering way. The system further contains a coherent light source placed in the first focal point of the ellipsoid. The second focal point of the ellipsoid defines the area in which an image-receiving object is to be placed. All the SLMs are illuminated by a diverging light beam emitted from the coherent light source. In each SLM, the light is subjected to phase-amplitude modulation and is converted into an image-carrying beam, which convergently fells onto the object on which the target image is to be produced. Thus, a pattern is formed on the object by a maskless method in which a plurality of SLMs are combined into a common image-forming holographic unit.

DETAILED DESCRIPTION OF THE INVENTION

The present invention relates to the semiconductor industry, in particular, to maskless microlithography, and more specifically to a system and method of forming a lithographic image with the use of digital holograms on curvilinear second-order surfaces of bodies of revolution, in particular on a part of the surface of an ellipsoidal body of revolution. For simplicity of the description, such holographic image formation system with the use of reflective concave curvilinear holograms will be further referred to merely as "holographic image formation system".

Figure 1:
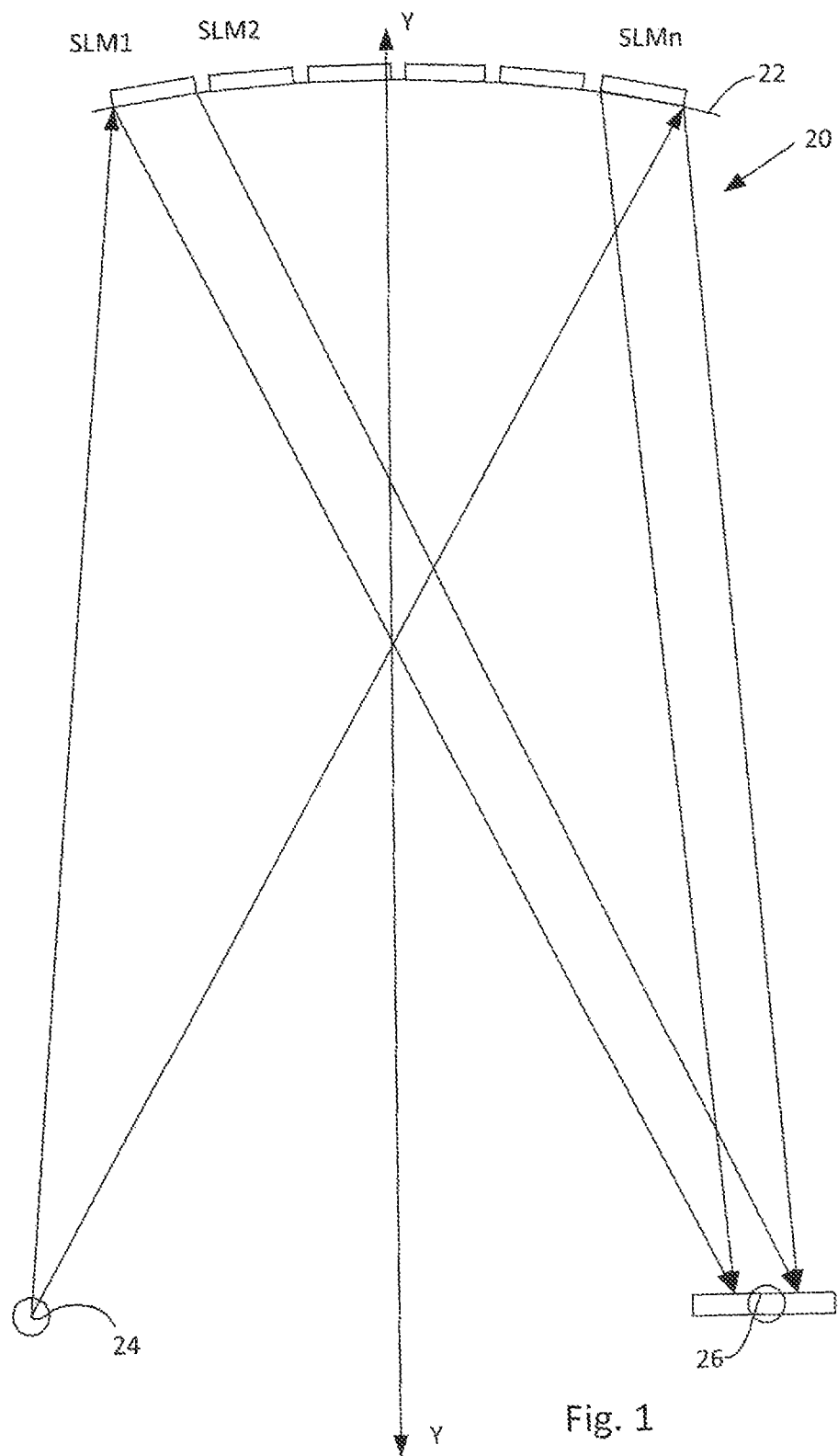
FIG. 1 is a simplified schematic view of the holographic image formation system of the invention.

The main principle of the invention will be better understood with reference to FIG. 1, which is a simplified schematic view of the holographic image formation system of the invention, which is designated by reference numeral 20.

As can be seen from FIG. 1, the system consists of a plurality of flat spatial light modulators (hereinafter SLMs) arranged in a matrix manner on a curvilinear spatial light modulator holder (hereinafter SLM holder) 22, a coherent light source 24, and an object 26 on which an image is to be formed.

In the context of the present invention, the term "SLM" means a computer-controllable reflective spatial light modulator formed by a matrix of reflective dynamically controllable cells. In fact, each SLM as well as a combination of a plurality of SLMs may form a dynamic reflective holographic mask suitable for use in microlithography for manufacturing patterned chips, or the like. A reference to an SLM suitable for purposes of the present invention may be found, in U.S. Pat. No. 10,168,668 issued on Jan. 1, 2019 to V. Yankov, et al.

Since a unique feature of any hologram is an ability of reproducing an image independently, assembling of the SLM-1, SLM-2, ... SLM-n into a unit shown in FIG. 1, form an integrated reflective holographic units of an essentially increased capacity, which makes it possible to form lithographic holographic units of a higher image-reproduction resolution.

Figure 2:
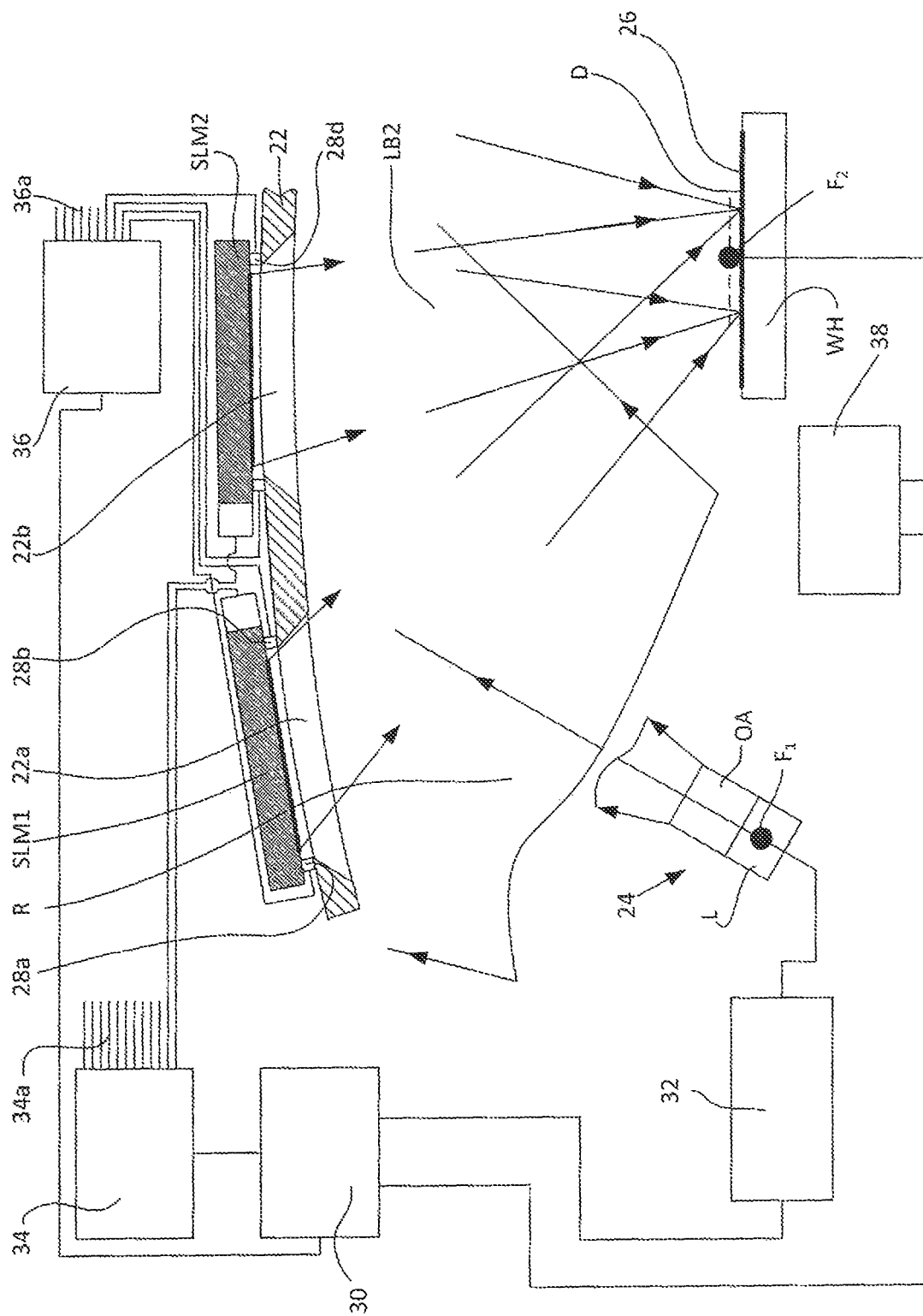
FIG. 2 is a schematic view that shows main components of the entire system of FIG. 1.

Main components of the entire system of FIG. 1 are depicted in more detail in FIG. 2, which, for the sake of simplicity, is shown not on scale and with omissions of traces of some light beams.

In FIG. 2, reference numeral 22 designates the SLM holder, which has a plurality of openings (only two of which, i.e., openings 22a and 22b are shown in the drawing). Positions of these openings are aligned with respective SLMs such as SLM-1, SLM-2, ... SLM-n shown in FIG. 1, which are supported by the SLM holder 22. The openings 22a, 22b, etc. are needed for passing light beams, reflected from respective SLMs (only two such openings, i.e., an opening 22a and 22b are shown in FIG. 2). These openings have a shape not obstructing the passage of the beam. In the illustrated case the opening are tapered in the upward converging direction.

The SLM holder 22 has a shape of an ellipsoidal body of revolution, but the SLMs have flat shapes.

In FIG. 2, symbol 24 designates the light source shown in FIG. 1 that contains a laser L and an optical system OA. Reference symbol WH designate an object holder for holding an object being treated such as a semiconductor wafer 26 on which a pattern has to be formed by the system 20 of the invention. The wafer holder WH and, hence, the wafer, are located in a position where beams reflected from all SLMs are delivered.

The light source 24 generates a diverging light beam R with a predetermined degree of divergence which defines the size of the working area of the system formed by the set of the SLMs, i.e., SLM-1, SLM-2, ... SLM-n so that the surfaces of all SLMs could be illuminated by the beam R.

Each SLM is provided with at least two respective actuators, such as, e.g., micro-piezo actuators 28a and 28b on the holder 22 for controlling orientation of the SLM-1 relative to the ellipsoidal surface of the holder, and actuators 28c and 28d on the holder 22 for controlling orientation of the SLM-2 relative to the ellipsoidal surface of the holder 22. It is understood that although only two pairs of the actuators are shown in FIG. 2, each SLM of the system 20 is provided with such actuators. In ideal situation, the SLMS should have a reflective surface defined by an ellipsoidal body of revolution, as the holder 22. However, since the reflective SLM surface is flat, a certain compensational adjustment is needed for orientation of the reflective surfaces of the SLMs as close as possible to the ellipsoidal surface of the SLM holder 22.

In other words, in order to provide the best possible image resolution for the converging image-carrying beam that falls on the surface of the object 26, the system incorporates an image processor 38, which is connected to a CPU 30 for reproducing a reference image of a pattern on the object and for using the produced image to adjust angular positions of the SLM via the micro-piezo actuators 28a and 28b for improving the quality of the image reproduction in the subsequent process.

In other words, the reference image is reproduced on the object, and positions of the spatial light modulators are adjusted relative to the concave semi-ellipsoidal surface while the reference image reproduced by the image processor is compared with an image reproduced by the spatial light modulators.

Such an adjustment is made only once at the manufacturer's facility by placing onto the object holder a sharpness adjustment image sensor D. A description of this sensor is omitted since it is beyond the scope of the present invention.

The CPU is connected to the laser light source via a laser driver 32 and with SLMs via a spatial light modulator driver 34 and an actuator driver 36.

Multiple outlet leads 34a and multiple outlet leads 36a show that each micro-piezo actuator receives a signal form the CPU 30.

Furthermore, the CPU 30 incorporates a compensation function that converts the reflection of the light from flat reflective surfaces of the SLMs into virtual reflection from ellipsoidal body of revolution that would have to exist on the SLMs.

Adjustment of SLM Angular Positions

Figure 3:
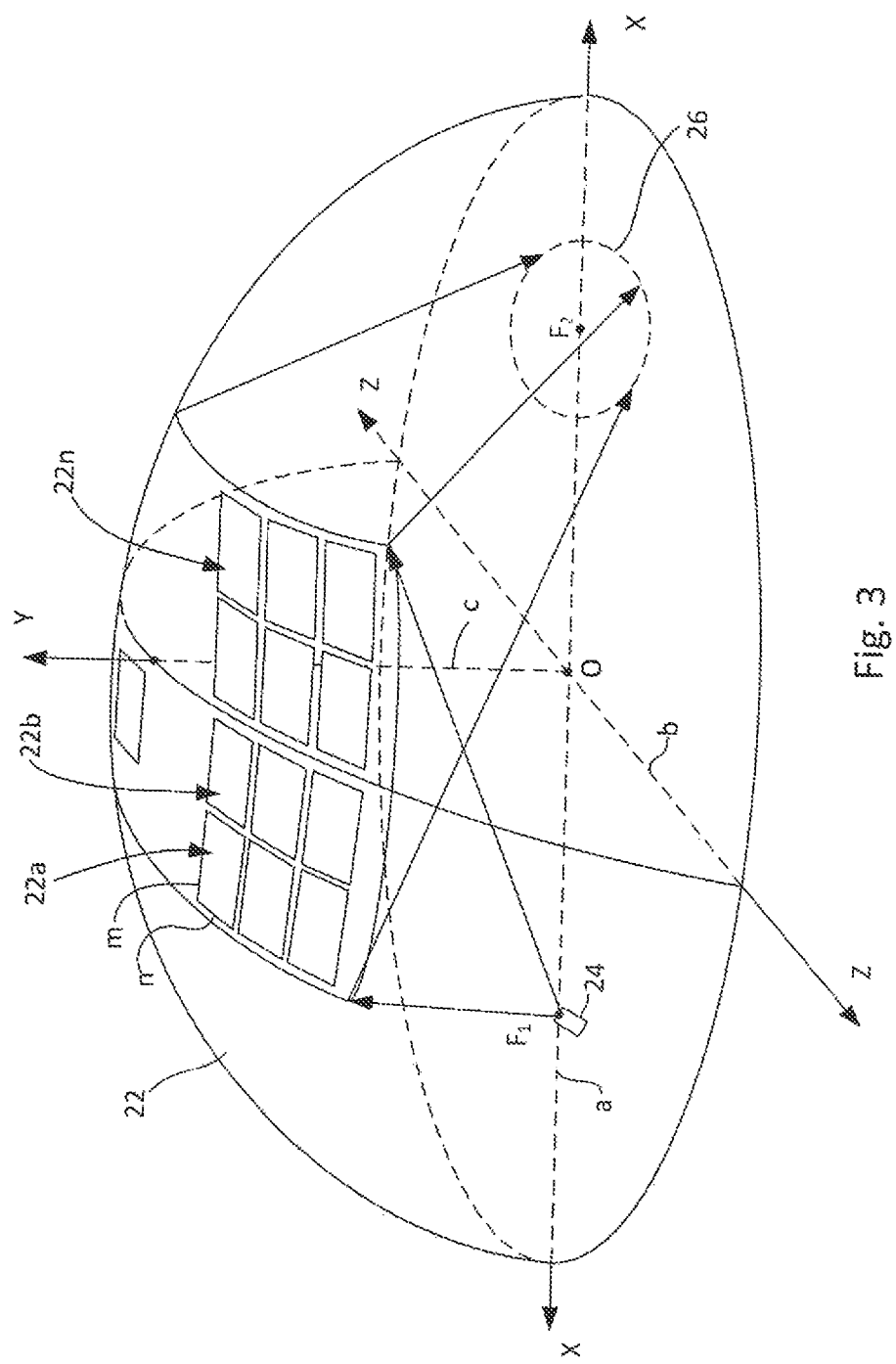
FIG. 3 is a model of a semi-ellipsoid used in the maskless lithography system of the invention with the use of curvilinear hologram.
Figure 4:
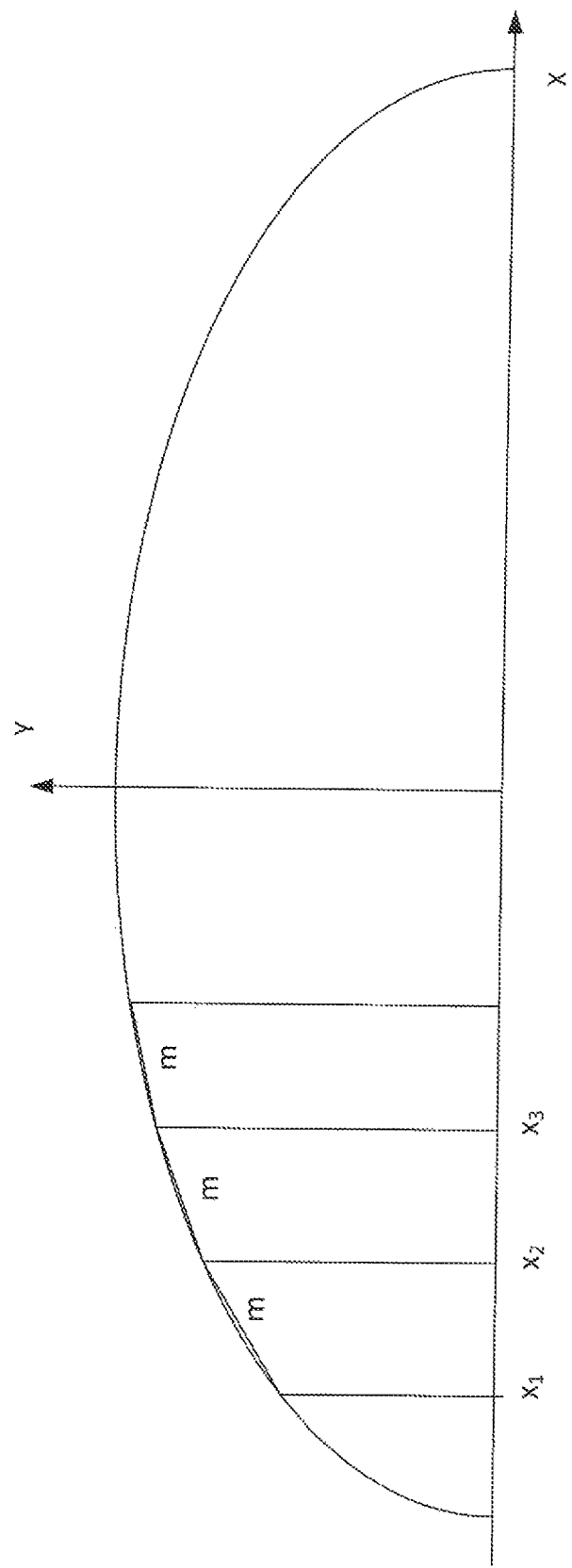
FIG. 4 is a sectional view of the semi-ellipsoid of FIG. 3 in the X-Y plane.

According to the invention, the reflecting surface is composed of a set of flat rectangular SLMs. In order to cover the surface of the ellipsoidal SLM holder 22 with maximal density, the rectangular SLMs are to be arranged in special way. The surface covering procedure is described below with reference to FIGS. 3 and 4, where FIG. 3 is a model of a semi-ellipsoid used in the maskless lithography system of the invention with the use of curvilinear holograms, and FIG. 4 is a sectional view of the semi-ellipsoid of FIG. 3 in the X-Y plane with the center of coordinates in point O. In these drawings, a, b, and c designate principle semi-axes of the semi-ellipsoid 22 (FIGS. 1, 2, and 3), where principle semi-axes b and c are equal (b=c); x, y and z are axes of the orthogonal coordinate system in which the model semi-ellipsoid is built and on which coordinates of the SLM are determined; 22a, 22b, . . . 22n are multiple SLMs that cover the surface of the semi-ellipsoidal SLM holder 22; F1 is a first focal point of the semi-ellipsoid of revolution in which the coherent-light source 24 is located; F2 is a second focal point located on the image object 26 onto which the image beams reflected from all SLM fall; In analog with the geographic coordinate system, n is a length of latitude size of a unit SLM, and m is a longitude size of a unit SLM.

Covering Procedure

It is understood that the smaller is the size of the SLM, the greater is the number of SLMs that can cover the concave semi-ellipsoidal surface, and the higher is a degree of coverage of the semi-ellipsoidal surface of the holder 22 with flat SLMs.

Based on the designations, mentioned above, an ellipsoidal surface of the aforementioned model can be presented by the following equation (1):

$$\frac{x^2}{a^2} + \frac{y^2 z^2}{b^2} = 1, \quad (1)$$

Consider now a system of latitude sections orthogonal to the symmetry axis x: $\{x=x_i\}$ (FIG. 4), where x1, x2, . . . $x_i$, are x-axis coordinates of a point on the surface of the ellipsoid. Each section is semicircular with radius $$r_i = b\sqrt{1 - \frac{x_i^2}{a^2}}.$$

The first latitude section $x=x_1$ is chosen so that two n chords could be inscribed into the corresponding semicircle cross-section. That is $r_1 = n/\sqrt{2}$ and $$x_1 = a\sqrt{1 - \frac{n^2}{2b^2}}.$$

The next section $x=x_2$ is chosen so that the chord of ellipsoid $$\frac{x^2}{a^2} + \frac{y^2}{b^2} = 1$$

connecting the first and the second sections is equal to m, and so on. Each pair of consecutive sections cuts an ellipsoidal half-ring from the half-ellipsoid, which must be covered with rectangular SLM as tight as possible. The simplest way to do it is to inscribe a chain of chords with length n into the smallest of two semicircles so that chords will define a placement of rectangular SLMs.

The described set of rectangular SLMs will definitely not completely cover the half-ellipsoid surface. There will be gaps between neighboring SLMs. Moreover, any SLM inevitably has a frame and some gaps between the SLM elements. These facts will not destroy the image being restored because there is no one-to-one correspondence between hologram and image elements. It can be said that any holographic SLM element contains some part of information from all image elements, just like any point in spaces between frequencies of the Fourier image of any function that participates in the restoration of any value of that function. This means that gaps and frames from the SLM composition will not appear on the restored image but slightly reduce quality of all the SLM elements.

Initial SLM Calibration

The reference and restoration waves, which are base terms in holographic imaging process, are supposed to be diverging spherical waves with focuses in the ellipsoid focuses. Therefore, they must be mutually conjugated. It is obvious that a set of flat rectangular SLMs in the positions described above will not gather diverging spherical waves from one ellipsoid focus to another perfectly well. In addition to the adjustment of the angular positions of the reflective SLM planes, the CPU 30 incorporates a compensation function that converts the reflection of the light from flat reflective surfaces of the SLMs into virtual reflection from ellipsoidal body of revolution that would have to exist on the SLMs. It is necessary to define preset positions of each element of each SLM to simulate near perfect ellipsoidal piece of surface. For the first approximation, it could be a structure similar to the Fresnel lens.

Let $F_1$ and $F_2$ be the ellipsoid focuses and E be the position of i-th element of j-th SLM. Consider the difference $F_1 E_{ij} F_2 - 2a$, where $F_1 E_{ij} F_2$ is the optical path length of light ray from $F_1$ to $F_2$ reflected on element $E_{ij}$. That element position should be changed to $E^*_{ij}$, which is the nearest to the $E_{ij}$ so that $$\left\{ \frac{F_1 E^*_{ij} F_2 - 2a}{\lambda} \right\} \approx 0.$$

Here { } brackets mean a fractional part of a number. The aforementioned positions of SLM elements must be considered as an initial approximation of SLM calibration. In fact, predetermined positions of SLMs as well as of the other elements of the scheme will inevitably differ from real ones.

That is why further automated calibration process must be implemented, where a spherical source must be in one ellipsoid focal point and a high-resolution camera connected to a computer in other focal point. The computer must be connected to all SLMs and be able to control them. Camera must capture a light blurred spot at the focal point and send it to the computer. There must be defined a functional of difference between captured blurred spot and predetermined ideal one. Consider this functional as a target functional minimized as follows: $Q(E^*_{11}, E^*_{12}, \ldots, E^*_{ij}, \ldots) \to \min$. Any standard optimization algorithm may be implemented to solve that problem, e.g., by using the steepest descent iterative algorithm, which involves a gradient descent method. The gradient descent is a first-order iterative optimization algorithm for finding the minimum of a function. To find a local minimum of a function using gradient descent, steps are to be taken proportional to the negative of the gradient (or approximate gradient) of the function at the current point.

A method of maskless lithography with the use of a curvilinear hologram, the method consists of the following steps: providing a system that contains a concave semi-ellipsoidal spatial light modulator holder having a concave semi-ellipsoidal surface that supports a plurality of flat rectangular spatial light modulators which cover the semi-ellipsoidal surface of the holder and are arranged in side-by-side positions, concave semi-ellipsoidal surface having a first focal point and a second focal point; placing a coherent light source in the first focal point and an image-receiving object in the area of the second focal point; illuminating all spatial light modulators with a diverging light beam emitted from the coherent light source; subjecting the light received by each spatial light modulator to phase-amplitude modulation thus converting the illumination light into an image-carrying beam; and converging the image-carrying beam onto the object, thus producing a target image on the object.

In addition, the method involves a step of improving a quality of image reproduction by: providing the system with a central processing unit, an image processor, and a reference image; reproducing the reference image on the object; and adjusting positions of the spatial light modulators relative to the concave semi-ellipsoidal surface while comparing the reference image reproduced by the image processor with an image reproduced by the spatial light modulators.

Thus, it has been shown that according to the invention, an image or pattern is formed on an object by a maskless method in which a plurality of SLMs are combined into a common image-forming holographic unit.

Although the invention has been described and shown with reference to specific drawings, it is understood that the description and drawings should not be construed as limiting the scope of the invention and that any changes and modifications which do not go beyond the scope of the attached claims are possible.

What is claims is:

1. A system of maskless lithography for forming an image on an object with the use of a curvilinear hologram, the system comprising:
    a spatial light modulator holder having a concave semi-ellipsoidal surface, a first focal point, and a second focal point;
    a plurality of spatial light modulators covering the concave semi-ellipsoidal surface of the spatial light modulator holder, each spatial light modulator converting a light beam falling onto said spatial light modulator into a converging image-carrying beam reflected therefrom onto the object; and
    a coherent light source that emits a diverging beam and is located in the first focal point for illuminating all spatial light modulators of said plurality with the diverging beam, the object being located in an area of the second focal point.

2. The system of claim 1, wherein the coherent light source is a laser light source, the system further comprising a central processing unit.

3. The system of claim 2, further comprising at least two micro-piezo actuators located between each spatial light modulator and the spatial light modulator holder for controlling a position of each spatial light modulator relative to the semi-ellipsoidal concave surface of the spatial light modulator holder, each micro-piezo actuator having an actuator driver and being connected to the central processing unit via said actuator driver.

4. The system of claim 3, wherein each spatial light modulator having a spatial light modulator driver and being connected to the central processing unit via the spatial light modulator driver.

5. The system of claim 4, further comprising an image processor, which is connected to the central processing unit for reproducing a reference image to adjust angular positions of the SLM via the micro-piezo actuators.

6. The system of claim 2, wherein each spatial light modulator having a spatial light modulator driver and being connected to the central processing unit via the spatial light modulator driver.

7. The system of claim 2, further comprising an image processor, which is connected to the central processing unit for reproducing a reference image to adjust angular positions of the SLM via the micro-piezo actuators.

8. A method of maskless lithography with the use of a curvilinear hologram, the method comprising:
    providing a system that contains a concave semi-ellipsoidal spatial light modulator holder having a concave semi-ellipsoidal surface that supports a plurality of flat rectangular spatial light modulators which cover the semi-ellipsoidal surface of the holder and are arranged in side-by-side positions, concave semi-ellipsoidal surface having a first focal point and a second focal point;
    placing a coherent light source in the first focal point and an image-receiving object in the area of the second focal point;
    illuminating all spatial light modulators with a diverging light beam emitted from the coherent light source;
    subjecting the light received by each spatial light modulator to phase-amplitude modulation thus converting the illumination light into an image-carrying beam;
    converging the image-carrying beam onto the object, thus producing a target image on the object.

9. The method of claim 8, further comprising a step of improving a quality of image reproduction by: providing the system with a central processing unit, an image processor, and a reference image; reproducing the reference image on the object; and adjusting positions of the spatial light modulators relative to the concave semi-ellipsoidal surface while comparing the reference image reproduced by the image processor with an image reproduced by the spatial light modulators.

* * * * *